US008751989B1

(12) United States Patent
Harrer et al.

(10) Patent No.: US 8,751,989 B1
(45) Date of Patent: Jun. 10, 2014

(54) COST-FUNCTION BASED ROUTING TECHNIQUES FOR REDUCING CROSSTALK IN ELECTRONIC PACKAGE DESIGNS

(71) Applicant: International Business Machines Corporation, Armonk, NY (US)

(72) Inventors: Hubert Harrer, Schoenaich (DE); Philip Scott Honsinger, Hopewell Junction, NY (US); Andreas Huber, Leonberg (DE); Dierk Kaller, Schoenaich (DE); Martin Kindscher, Waldenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/766,722

(22) Filed: Feb. 13, 2013

(51) Int. Cl.
*G06F 17/50* (2006.01)
(52) U.S. Cl.
USPC ................ 716/115; 716/128; 716/137
(58) Field of Classification Search
USPC .......................... 716/115, 128, 137
See application file for complete search history.

(56) References Cited

U.S. PATENT DOCUMENTS

| 6,189,131 | B1 * | 2/2001 | Graef et al. ............... 716/113 |
| 7,043,708 | B2 | 5/2006 | Tetelbaum et al. |
| 7,093,223 | B2 | 8/2006 | Becer et al. |
| 7,493,583 | B1 | 2/2009 | Weiss |
| 7,716,621 | B1 | 5/2010 | Li et al. |
| 7,735,048 | B1 * | 6/2010 | Zhang et al. ............... 716/104 |
| 7,761,826 | B1 | 7/2010 | Thanvantri et al. |
| 2004/0243956 | A1 * | 12/2004 | Tetelbaum et al. ........... 716/6 |
| 2005/0120316 | A1 * | 6/2005 | Suaya et al. ................ 716/4 |
| 2007/0106969 | A1 * | 5/2007 | Birch et al. ................ 716/6 |

* cited by examiner

*Primary Examiner* — Suresh Memula
(74) *Attorney, Agent, or Firm* — Yudell Isidore Ng Russell PLLC; Matthew W. Baca (57) ABSTRACT

A technique for routing signal traces in an electronic package design includes extracting near-end and far-end crosstalk values for traces and vias from a model of the electronic package design. The extracted values are then length-normalized and the normalized values are allocated to coupling factors of a cost-function. A first bus routing for the electronic package design is performed to provide a first routed design. Length segments from the first routed design are extracted and inserted in the cost-function. Crosstalk for each bus net is accumulated using the cost-function. In response to the accumulated crosstalk being less than a determined limit, the first routed design is saved. In response to the accumulated crosstalk being greater than the determined limit, an additional bus routing for the electronic package design is performed.

21 Claims, 6 Drawing Sheets

COST-FUNCTION BASED ROUTING TECHNIQUES FOR REDUCING CROSSTALK IN ELECTRONIC PACKAGE DESIGNS

BACKGROUND

The present invention generally relates to reducing crosstalk in electronic package designs and, in particular, to cost-function based routing techniques for reducing crosstalk in electronic package designs.

Wire routing (routing) is one step in the electronic design of integrated circuits (ICs), printed circuit boards (PCBs), and electronic package designs (e.g., multi-chip modules (MCMs)). Wire routing builds on a preceding placement step, which determines the location of each active element of an IC, component on a PCB, or integrated circuit (chip) on an MCM. After placement, the routing step adds wires needed to properly connect the placed elements, components, chips, or PCBs while obeying all design rules. Routers are typically provided with pre-existing polygons for pins (or terminals) of cells and some pre-existing wiring (or pre-routes). Each of the polygons is associated with a net, usually by name or number. The primary task of a router is to create geometries such that all terminals assigned to the same net are connected, no terminals assigned to different nets are connected, and all design rules are obeyed.

A router can fail by not connecting terminals that should be connected (an open), by connecting two terminals that should not be connected (a short), and/or by violating a design rule. Routers may also be configured to ensure an electronic design meets timing requirements, has no crosstalk problems, meets any metal density requirements, and/or does not suffer from antenna effects, etc. Almost every problem associated with routing is known to be intractable. The simplest routing problem (commonly referred to as a Steiner Tree Problem) of finding the shortest route for one net in one layer with no design rules is NP-hard, even if only horizontal and vertical wires are allowed. Variants of channel routing, as well as routing to reduce crosstalk, the number of vias, etc., have also been shown to be NP-complete. In practice, routers seldom attempt to find an optimum result. That is, routers typically attempt to find a solution that is good enough based on some established criteria.

Design rules for ICs sometimes vary considerably from layer to layer. For example, the allowed width and spacing on lower metal layers may be four or more times smaller than the allowed width and spacing on upper metal layers. Different wire width and wire spacing for different metal layers of an IC results in additional complications not faced by routers for other applications, e.g., PCB or multi-chip module (MCM) design. In particular, difficulties ensue if the design rules are not simple multiples of each other and when vias must traverse between layers with different rules. The earliest types of electronic design automation (EDA) routers were manual routers, i.e., a designer clicked a mouse on an endpoint of each line segment of each net to route a wire. Modern electronic design software typically provides interactive routers, i.e., a designer selects a pad and clicks a few places to give the router an idea of where to go and the router attempts to place wires as close to that path as possible without violating design rules.

Some more advanced interactive routers have 'push' and 'shove' features that allow the routers to push nets out of the way, if possible, in order to place a new wire where a designer wants the wire and still avoid violating design rules. Modern EDA software also typically provides auto-routers, which route remaining un-routed connections without human intervention. Auto-routers may take various forms. For example, an auto-router may take the form of a maze router, a line probe router, a channel router, an area router, or a switchbox router. An auto-router may, for example, first determine an approximate course for each net, e.g., route on a coarse grid or perform global routing. In general, global routing limits the size and complexity of subsequent detailed routing steps, which can be done square-by-square on a routing grid.

For detailed routing, the most common technique is rip-up and reroute, which includes: selecting a sequence in which the nets are to be routed; routing each net in the sequence; and, if not all nets can be successfully routed, applying any of a variety of clean-up methods, in which selected routings are removed, the order of the remaining nets to be routed is changed, and the remaining routings are attempted again. In general, the rip-up and reroute technique repeats until all nets are routed or the routing program (or a user of the program) gives up. An alternative multi-pass iterative-improvement routing approach treats shorts, design rule violations, obstructions, etc. on a similar footing as excess wire length, i.e., as finite costs to be reduced (at first) rather than as absolutes to be avoided. The multi-pass iterative-improvement routing approach, for each of several iterative passes, includes: prescribing or adjusting weight parameters of an objective function (having a weight parameter value for each unit of excess wire length, and for each type of design rule violation).

For example, in the multi-pass iterative-improvement routing approach, during a first pass excess wire length may typically be given a high cost, while design violations such as shorts, adjacency, etc. are given a low cost. In later passes, the relative ordering of costs is changed so that violations are high-cost or may be prohibited. A sequence in which nets are to be routed during the pass are then selected or randomly chosen. Each net, in turn, is then ripped-up (if previously routed) and re-routed so as to minimize the value of the objective function for the net. Typically, some of the routings will have shorts or other design rule violations. A next iterative pass is then processed until routing is complete and correct, is not further improved, or some other termination criterion is satisfied. Most routers assign wiring layers to carry predominantly 'x' or 'y' directional wiring, although there are routers that avoid or reduce the need for directional wiring assignment. In general, restricting wiring direction simplifies power supply design and control of inter-layer crosstalk. However, allowing arbitrary routes may reduce the need for vias and decrease the number of required wiring layers.

BRIEF SUMMARY

A technique for routing signal traces in an electronic package design includes extracting near-end and far-end crosstalk values for traces and vias from a model of the electronic package design. The extracted values are then length-normalized, and the normalized values are allocated to coupling factors of a cost-function. A first bus routing for the electronic package design is performed to provide a first routed design. Length segments from the first routed design are extracted and inserted in the cost-function. Crosstalk for each bus net is accumulated using the cost-function. In response to the accumulated crosstalk being less than a determined limit, the first routed design is saved. In response to the accumulated crosstalk being greater than the determined limit, an additional bus routing for the electronic package design is performed.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein.

DETAILED DESCRIPTION

The illustrative embodiments provide a method, a data processing system, and a computer program product (embodied on a computer-readable storage device) for routing signal traces in an electronic package design based on a cost-function.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It is understood that the use of specific component, device, and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

In electronics, crosstalk broadly refers to any phenomenon in which a signal transmitted on one circuit or channel creates an undesired effect in another circuit or channel. Crosstalk may be caused by undesired capacitive, inductive, or conductive coupling from one circuit, part of a circuit, or channel, to another circuit, part of a circuit, or channel. As one example, crosstalk may be caused by a signal transmitted on one conductive trace (or signal wire) that causes electromagnetic interference (EMI) in another conductive trace. Near-end crosstalk (NEXT) refers to interference between two traces measured at a transmitter-end of the trace and far-end crosstalk (FEXT) refers to interference between two traces measured at an end of the trace opposite the transmitter-end of the trace.

Scattering parameters (S-parameters) are widely used to describe the electrical behavior of linear electrical networks while undergoing various steady-state stimuli. Various electrical properties (e.g., gain, return loss, voltage standing wave ratio (VSWR), reflection coefficient, and amplifier stability) of electrical networks may be expressed using S-parameters. While applicable at any frequency, S-parameters are mostly used for networks operating at radio frequency (RF) and microwave frequencies, where signal power and energy considerations are more easily quantified than currents and voltages. S-parameters change with measurement frequency and, as such, frequency must be specified for any stated S-parameter measurements, as well as characteristic impedance or system impedance.

In general, increasing computer system performance has required increased complexity and increased wiring density at both the chip-level and the package-level. Unfortunately, high wiring densities in conjunction with multi-Gigabit processor speeds may lead to relatively strong electromagnetic interference (EMI) between adjacent bus lanes of a package design, which negatively affects signal integrity characteristics of the package design. Known approaches to design high-speed buses to maintain signal integrity have accounted for coupled noise during chip design. However, the known approaches have generally utilized time-domain or frequency-domain based simulation tools that require multiple re-simulations for each packaging design iteration. In particular, bus routing optimization may experience various pitfalls that are difficult to predict without exact routing criteria.

In general, each variation of a routing channel topology has conventionally required generation of respective two-dimensional (2D) and/or three-dimensional (3D) models and reconstruction of a physical channel-equivalent using model cascades to verify signal integrity prior to a final actual channel simulation. According to aspects of the present disclosure, techniques are implemented in a package design process to reduce routing and simulation efforts for a package design. The disclosed techniques advantageously facilitate significant reductions in routing and simulation effort through the implementation of cost-function based bus routing.

According to various aspects of the present disclosure, accumulated near-end crosstalk (NEXT) and far-end crosstalk (FEXT) are computed for all relevant high-speed bus nets within an electronic package design concurrently with trace routing for the package design. The NEXT and FEXT may then be utilized to control the routing process to minimize overall crosstalk of a package design. As the accumulated crosstalk is computed simultaneous with trace wiring, a package designer can modify unfavorable trace routes using a same design tool and avoid the time-consuming intermediate step of simulating the modified channel model following each routing iteration. In this case, simulation may be limited to confirming signal integrity at a conclusion of routing optimization. As such, the disclosed techniques provide a relatively straight-forward package design process.

The disclosed techniques take advantage of the fact that the vast majority of bus wiring structures in first level packages follow specific and repeatable geometric patterns (e.g., a c4-breakout via array in electronic package designs have been strictly adjusted to c4-solder-ball pitch of a chip and/or trace-to-trace spacing follows specific constraints dictated by multi-chip module (MCM) material, cross-section and real-estate). Given that the vast majority of bus wiring structures in first level packages follow specific and repeatable geometric patterns, NEXT and FEXT values for via-to-via coupling per-unit-length and trace-to-trace coupling per-unit-length, as well as attenuation per-unit-length (if desired), can be readily calculated. In general, NEXT and FEXT values are limited in number and repeatable for a given package. In one or more embodiments, computation of length-normalized NEXT and FEXT values is a one-time effort that requires an S-parameter model of specific package trace and via patterns. It should be appreciated that because S-parameter models are built based on specific and repeatable geometric patterns in an electronic package design (e.g., an MCM design) the patterns do not change as a bus can only be routed according to those patterns. In general, corner/vertex effects that occur when a bus-trace changes from a horizontal direction to a vertical direction (on a same layer) are negligible and, therefore, do not require separate modeling.

An S-parameter model may be evaluated in the time-domain (as a coupled step-response) or as an approximation at a fundamental bus frequency (directly from S-parameters in the frequency-domain). A set of derived length-normalized FEXT and NEXT values for all package-relevant trace-patterns and via-patterns in orthogonal and diagonal directions may then be utilized as coefficients in a cost-function $T_i$ that may be defined as follows:

$$T_i = \sum_i C_{Lh} I_{Lh} + \sum_i C_{Lv} I_{Lv} + \sum_i C_{Ld} I_{Ld} + \sum_i C_{Vh} I_{Lh} + \sum_i C_{Vv} I_{Vv} + \sum_i C_{Vd} I_{Vd}$$

where $T_i$ is the accumulated total coupling in millivolts (mV) for the $i^{th}$ signal trace, $C_{Lh}$ is the horizontal line-to-line coupling coefficient in millivolts (mV)/millimeter (mm), $C_{Lv}$ is the vertical line-to-line coupling coefficient in mV/mm, $C_{Ld}$ is the diagonal line-to-line coupling coefficient in mV/mm, $C_{Vh}$ is the horizontal via-to-via coupling coefficient in mV/mm, $C_{Vv}$ is the vertical via-to-via coupling coefficient in mV/mm, $C_{Vd}$ is the diagonal via-to-via coupling coefficient in mV/mm, $I_{Lh}$ is the horizontal line length element in mm, $I_{Lv}$ is the vertical line length element in mm, $I_{Ld}$ is the diagonal line length element in mm, $I_{Vh}$ is the horizontal via length element in mm, $I_{Vv}$ is the vertical length element in mm, and $I_{Vd}$ is the diagonal via length element in mm.

For the $i^{th}$ signal trace, the cost-function $T_i$ accumulates the products of all relevant line and/or via coupling coefficients with respective length elements (i.e., all line and/or via segments acting as aggressors to the adjacent $i^{th}$ signal trace segment are added resulting in a total coupling value for the specific signal trace). It should be appreciated that an optional line attenuation term may be added to the cost-function $T_i$ if desired. For example, in the event that package material exhibits significant loss, an attenuation term can be added (as a sum of a product of the line attenuation and line length).

In order to manage package complexity during physical package design, fully automated electronic design automation (EDA) tools are widely used for trace routing. Automated routing may be governed by generic rules, such as line spacing, maximum trace length, etc. According to one embodiment, a cost-function may be implemented as a complex rule that allows a physical designer to either minimize accumulated total coupling across all signal traces or keep nets with the highest coupling contribution below certain limits in an iterative manner. Based on concurrent computation of the cost-function, a package designer may determine (following each wiring modification) whether the objective to reduce the accumulated coupling below a certain threshold can be achieved.

As may be used herein, the term 'netlist' describes the connectivity of a cell of an electronic design. A netlist includes 'ports', 'instances', 'nets', and 'pins'. Ports are the external interface of a cell. An instance is a reference to a cell, and ports of the cell are referred to as pins. A net is the logical connection of multiple pins or ports. In general, zero or one pin nets may exist. Routing of wires for an electronic package design is generally performed on a three-dimensional (3D) grid that forms a graph that includes vertices and edges, which are each covered by at most one object. It should be appreciated that a routing grid may be different on different metal layers. In general, the main goal of a router is to embed all desired connections while meeting various requirements, e.g., spacing rules. As may be used herein, a 'segment' is a part of a wire that is bounded by two endpoints and a 'via' is a segment in the 'z' direction that spans exactly one edge of a routing grid. Pin shapes are the physical representation of a pin. Different pins may have multiple disjoint pin shapes. Port shapes are the physical representation of a port. Different ports may have multiple disjoint port shapes.

A wire includes a path of segments and vias that connect multiple pins or port shapes of the same net. In general, a wire is the physical representation of a net. The term 'shape' refers to two-dimensional (2D) objects on a same metal layer. A wire code defines physical properties of segments on each allowable metal layer. The physical properties typically include a wire width and minimum spacing to other shapes on the same (or occasionally different) metal layers.

Figure 1:
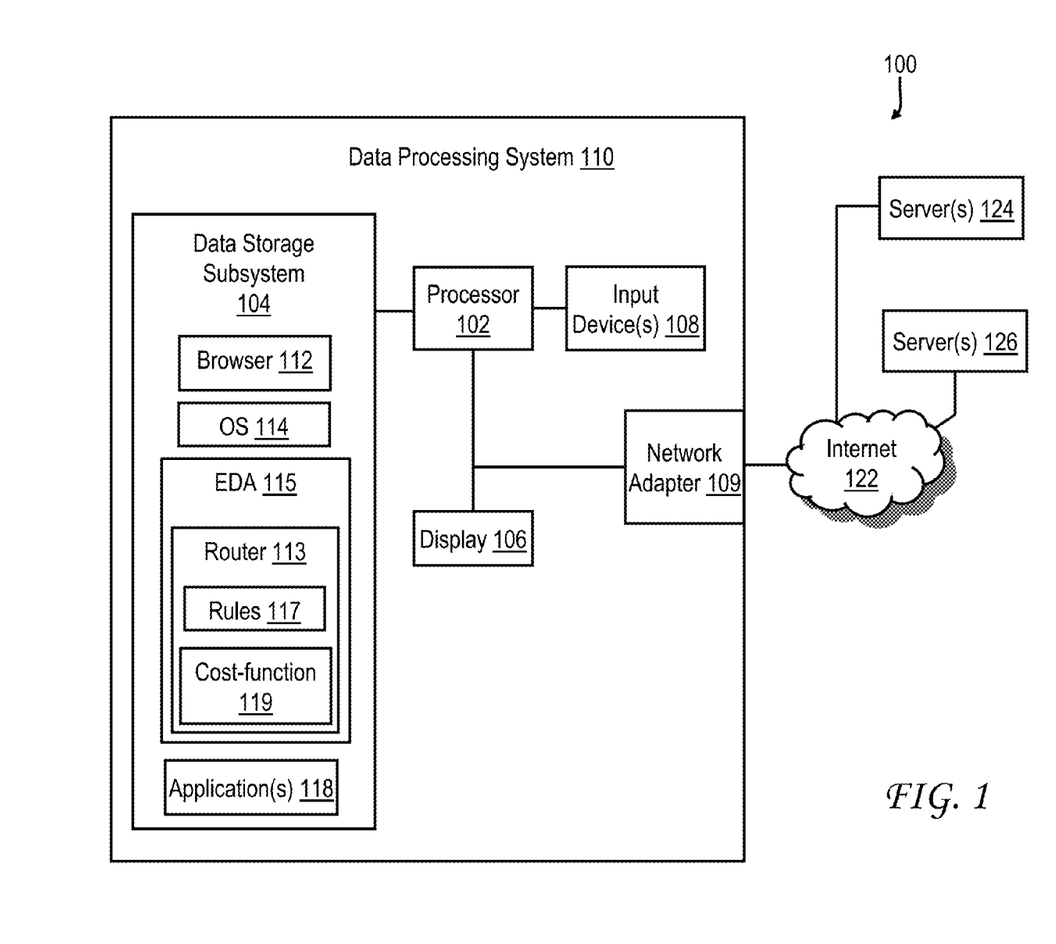
FIG. 1 is a diagram of a relevant portion of an exemplary data processing system environment that includes a data processing system that executes electronic design automation (EDA) software that is configured, in accordance with various embodiments of the present disclosure, to route traces and vias in an electronic package design based on a cost-function that accumulates crosstalk.

With reference to FIG. 1, an exemplary data processing environment 100 is illustrated that includes a data processing system 110 that is configured to route signal wires in an electronic package design based on a cost-function according to one or more embodiments of the present disclosure. Data processing system 110 may take various forms, such as workstations, laptop computer systems, notebook computer systems, or desktop computer systems and/or clusters thereof. Data processing system 110 includes a processor 102 (which may include one or more processor cores for executing program code) coupled to a data storage subsystem 104, a display 106, one or more input devices 108, and a network adapter 109. Data storage subsystem 104 may include, for example, application appropriate amounts of various memories (e.g., dynamic random access memory (DRAM), static RAM (SRAM), and read-only memory (ROM)), and/or one or more mass storage devices, such as magnetic or optical disk drives.

Data storage subsystem 104 includes an operating system (OS) 114 for data processing system 110. Data storage subsystem 104 also includes application programs, such as a browser 112 (which may optionally include customized plug-ins to support various client applications), and other applications (e.g., a word processing application, a presentation application, and an email application) 118, as well as electronic design automation (EDA) software 115, which implements a router 113 configured according to one or more aspects of the present disclosure to route signal wires in an electronic package design (based on rules 117 and cost-function 119) to reduce crosstalk below a desired limit.

Display 106 may be, for example, a cathode ray tube (CRT) or a liquid crystal display (LCD). Input device(s) 108 of data processing system 110 may include, for example, a mouse, a keyboard, haptic devices, and/or a touch screen. Network adapter 109 supports communication of data processing system 110 with one or more wired and/or wireless networks utilizing one or more communication protocols, such as 802.x, HTTP, simple mail transfer protocol (SMTP), etc. Data processing system 110 is shown coupled via one or more wired or wireless networks, such as the Internet 122, to various file servers 124 and various web page servers 126 that provide information of interest to the user of data processing system 110.

Those of ordinary skill in the art will appreciate that the hardware components and basic configuration depicted in FIG. 1 may vary. The illustrative components within data processing system 110 are not intended to be exhaustive, but rather are representative to highlight components that may be utilized to implement the present invention. For example, other devices/components may be used in addition to or in place of the hardware depicted. The depicted example is not meant to imply architectural or other limitations with respect to the presently described embodiments.

Figure 2:
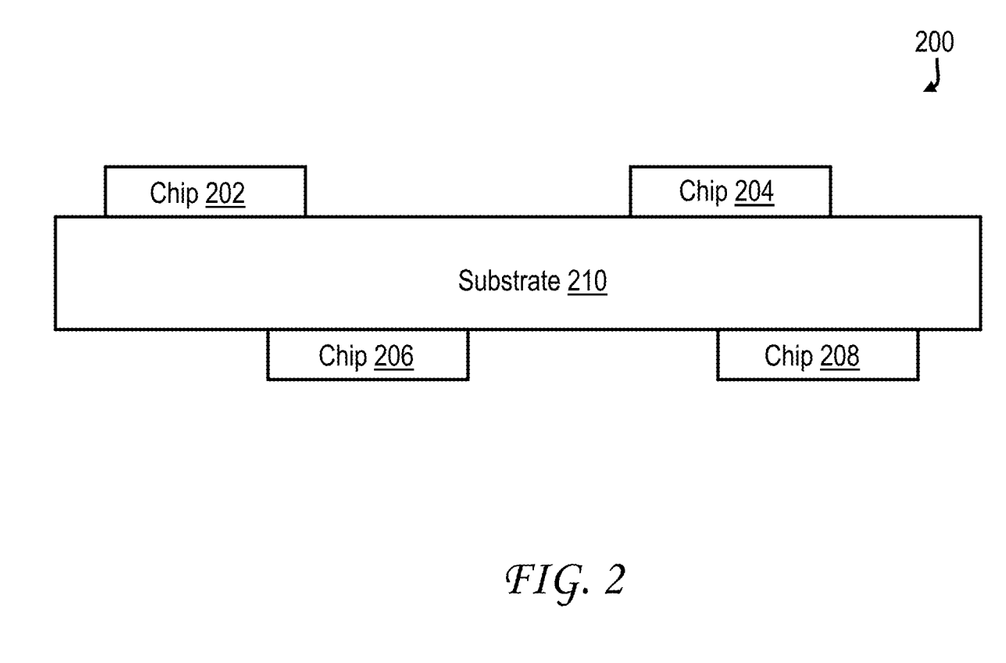
FIG. 2 is a side view of a relevant portion of an exemplary electronic package (i.e., a multi-chip module (MCM)

With reference to FIG. 2 a side view of a relevant portion of an exemplary electronic package (i.e., a multi-chip module (MCM)) 200 is illustrated that includes a number of chips 202, 204, 206, and 208 mounted on a substrate 210. In one or more embodiments substrate 210 is a glass-ceramic (GC) substrate that includes a number of metal layers that interconnect the chips 202-208. While four chips are shown in FIG. 2, it should be appreciated that an electronic package may include more or less than four chips. Moreover, it should be appreciated that the techniques disclosed herein are applicable to a broad array of substrates and are not limited to a GC substrate. While chips 202-208 are illustrated as being located on both sides of substrate 210, it should be appreciated that the techniques disclosed herein are applicable to electronic package designs that implement chips on only one side of a substrate.

Figure 3:
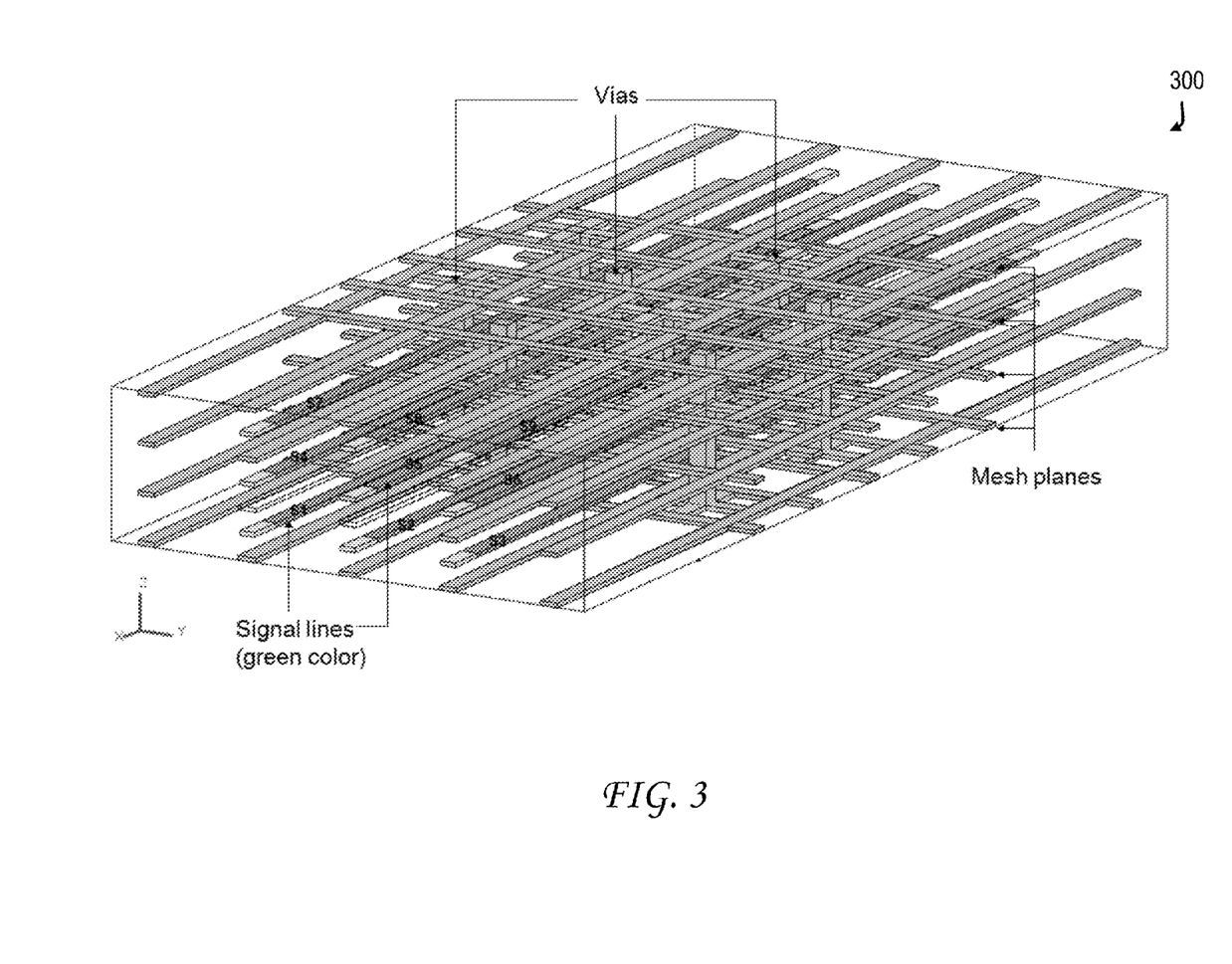
FIG. 3 is a three-dimensional view of a relevant portion of the exemplary electronic package of FIG. 2 that includes four mesh planes with signal lines and vias for routing signals.

With reference to FIG. 3, a three-dimensional view of a relevant portion of an exemplary electronic package 300 is illustrated that includes four mesh planes with signal lines and vias for routing signals. For example, electronic package 300 may correspond to a portion of electronic package 200 of FIG. 2. According to various aspects of the present disclosure, initially an S-parameter model computation of a regular geometric electronic package design (e.g., a glass-ceramic (GC) electronic package design) is performed, e.g., using three baseline models. For example, an S-parameter model may be constructed from geometric structures of traces and vias, as well as electrical characteristics of GC package material, employed in an MCM design. In general, any electromagnetic (EM) field-solver that is able to perform 3D field computations can be used to generate an S-parameter model. The S-parameter model (or other N-port model) provides S-parameter data (or other N-port model data) that represents electrical package characteristics, e.g., insertion loss, return loss, NEXT, FEXT (s11, s21, s31, . . . ) of top-side c4 vias, bottom-side vias, and traces (i.e., three baseline models). Extraction of NEXT and FEXT values for horizontal, vertical, and diagonal coupling for traces and vias may then be performed.

Figure 4:
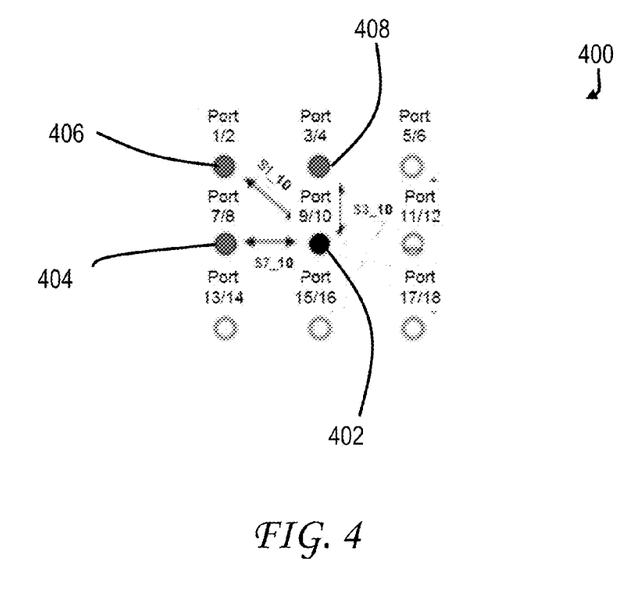
FIG. 4 is a diagram that illustrates exemplary crosstalk in a victim trace that is attributable to multiple aggressor traces.

With reference to FIG. 4, an exemplary diagram 400 depicts a package victim trace with three adjacent aggressor traces. A FEXT for the victim trace may be determined from S-parameter data that includes FEXT data for aggressor traces having various orientations inside a package at a frequency of interest (e.g., a bus frequency). For example, FEXT data for victim trace 402 may be obtained for horizontal (s7_10), vertical (s3_10), and diagonal (s1_10) coupling from aggressor traces 404, 408, and 406, respectively, at 3 GHz. As one example, horizontal, vertical and diagonal FEXT values may be extracted relative to a model trace length (e.g. 10 mm), bus frequency (e.g., 3 GHz) and input signal amplitude (e.g., 1V). For example, exemplary FEXT values may indicate horizontal line-to-line coupling of 2.4 mV; vertical line-to-line coupling of 6.0 mV; and diagonal line-to-line coupling of 1.8 mV. NEXT and FEXT values may then be length normalized and allocated to appropriate coupling factors of a cost-function.

In the example above, FEXT values may be normalized to 0.24 mV/mm for horizontal line-to-line coupling (CLh), 0.60 mV/mm for vertical line-to-line coupling (CLv), and 0.18 mV/mm for diagonal line-to-line coupling (CLd) based on a trace length of 10 mm. The normalized line coupling factors are then inserted into the cost-function $T_i$, which accumulates the coupling values. In the above example, for simplicity, only FEXT values for package traces have been taken into account. It should be appreciated that both NEXT and FEXT values for traces and vias should normally be considered in routing traces of any electronic package design. NEXT and FEXT values can be simply added together or weighted with factors, e.g., a*NEXT+b*FEXT, depending on whether the design is more sensitive to NEXT or FEXT, which is usually determined by the driver/receiver arrangement).

Figure 5:
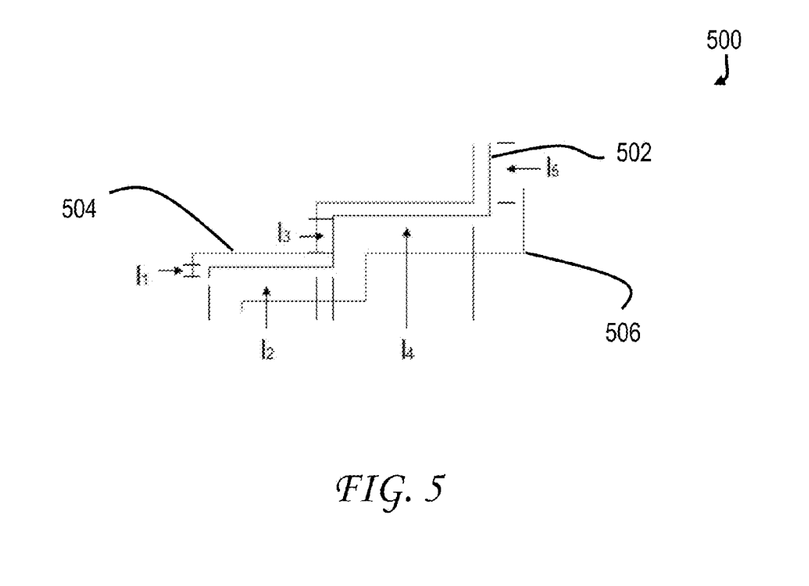
FIG. 5 is an exemplary bus net associated with the electronic package design of FIG. 2.

With reference to FIG. 5 an $i^{th}$ bus net is illustrated for an exemplary package design. In general, length segments of all bus nets (with their respective aggressors that couple into each net) are considered. FIG. 5 shows the $i^{th}$ bus-net with line segments ($l_1$, $l_2$, $l_3$, $l_4$, and $l_5$) for an adjacent horizontal aggressor net (including aggressors 504 and 506). It should be appreciated that vertical and diagonal aggressor bus nets that are above and below victim bus net 504 should also be considered. Length segments for all horizontal, vertical and diagonal trace length segments of all aggressors that couple into the $i^{th}$ bus net and horizontal, vertical, and diagonal trace coupling factors are inserted into the cost-function $T_i$. That is, the cost-function $T_i$ for the above example is given by:

$$T_i = 0.24(I_{h1}+I_{h2}+I_{h3}+I_{h4}+I_{h5})+0.6(I_{v1}+I_{v2}+I_{v3}+I_{v4}+I_{v5})+0.18(I_{d1}+I_{d2}+I_{d3}+I_{d4}+I_{d5})$$

In the above example $I_{hx}$ corresponds to the horizontal length segments, $I_{vx}$ corresponds to the vertical length segments (which are all zero in this case), and $I_{dx}$ corresponds to the diagonal length segments (which are all zero in this case) and $T_i$ yields the total FEXT on the $i^{th}$ bus net.

As mentioned above, the cost-function $T_i$ accumulates crosstalk for each bus net within the package. In general, the cost-function $T_i$ represents the worst case for all bus nets in terms of crosstalk. In the event that the accumulated crosstalk is less than a specified limit process flow is complete. In the event that the accumulated crosstalk is greater than a specified limit, the process flow may be continue with iterative bus routing in an attempt to further reduce the accumulated crosstalk.

Figure 6:
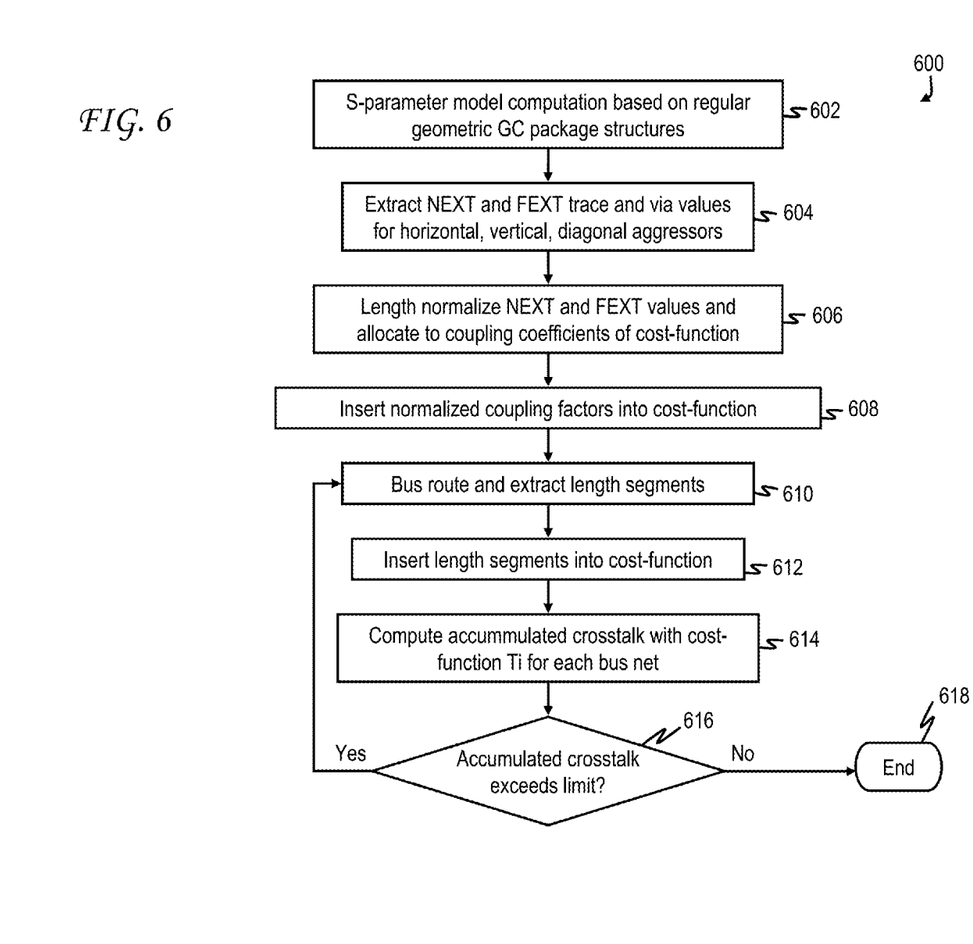
FIG. 6 is a flowchart of an exemplary process for routing signal traces in an electronic package design based on a cost-function according to one embodiment of the present disclosure.

With reference to FIG. 6, a flow chart of an exemplary process 600 for routing signal wires in an electronic package design based on a cost-function, according to one embodiment of the present disclosure, is illustrated. For example, process 600 may be executed by processor 102 of data processing system 110. At block 602, process 600 is initiated (e.g., when a user of data processing system 110 initiates execution of EDA 115 to compute an S-parameter model based on regular glass-ceramic (GC) package structure using three baseline models) at which point control transfers to block 604. In block 604, processor 102 extracts NEXT and FEXT values for horizontal, vertical, and diagonal coupling for traces and vias. Next, in block 606, processor 102 length normalizes the NEXT and FEXT values and allocates the values to coupling coefficients of the cost-function $T_i$. Then, in block 608, processor 102 inserts the normalized coupling coefficients into the cost-function $T_i$. Next, in block 610 processor 102 routes the bus nets and extracts length segments for the routed bus nets.

Then, in block 612 processor 102 inserts the extracted length segments into the cost-function $T_i$. Next, in block 614 processor 102 computes the accumulated crosstalk using the cost-function for each bus net. Next, in block 616, processor 102 determines if the accumulated crosstalk exceeds a desired limit. In response to the accumulated crosstalk exceeding the desired limit in block 616, control transfers to block 610 where processor 102 re-routes the bus nets and extracts length segments for the re-routed bus nets. In response to the accumulated crosstalk not exceeding the desired limit in block 616, control transfers to block 618 where process 600 terminates.

Accordingly, techniques have been disclosed herein that advantageously route bus nets in an electronic package design based on a cost-function.

In the flow charts above, the methods depicted in FIG. 6 may be embodied in a computer-readable medium containing computer-readable code such that a series of steps are performed when the computer-readable code is executed on a computing device. In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing, but does not include a computer-readable signal medium. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage subsystems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of routing signal traces in an electronic package design, comprising:
   extracting, using a data processing system, near-end and far-end crosstalk values for traces and vias from a model of the electronic package design;
   length-normalizing, using the data processing system, the extracted values and allocating the normalized values to coupling factors of a cost-function;
   performing, using the data processing system, a first bus routing for the electronic package design to provide a first routed design;
   extracting, using the data processing system, length-segments from the first routed design and inserting the extracted length-segments in the cost-function;
   accumulating, using the data processing system, crosstalk for each bus net using the cost-function;
   in response to the accumulated crosstalk being less than a determined limit, saving, using the data processing system, the first routed design; and
   in response to the accumulated crosstalk being greater than the determined limit, performing, using the data processing system, an additional bus routing for the electronic package design.

2. The method of claim 1, wherein the performing the additional bus routing for the electronic package design further comprises:
   performing a second bus routing for the electronic package design to provide a second routed design;
   extracting length-segments from the second routed design and inserting the extracted segments in the cost-function;
   accumulating crosstalk for each bus net of the second routed design using the cost-function;
   in response to the accumulated crosstalk for the second routed design being less than a determined limit for the second routed design, saving the second routed design; and
   in response to the accumulated crosstalk for the second routed design being greater than the determined limit for the second routed design, performing another additional bus routing for the electronic package design.

3. The method of claim 1, wherein the traces include horizontal traces, vertical traces, and diagonal traces.

4. The method of claim 1, wherein the vias include horizontal vias, vertical vias, and diagonal vias.

5. The method of claim 1, wherein the crosstalk values include near-end crosstalk values and far-end crosstalk values.

6. The method of claim 1, wherein the model is an S-parameter model.

7. The method of claim 1, wherein the electronic package design is a multi-chip module design.

8. The method of claim 7, wherein the multi-chip module design is a glass-ceramic multi-chip module design.

9. The method of claim 1, wherein the cost-function is given by:

$$T_i = \sum_i C_{Lh} l_{Lh} + \sum_i C_{Lv} l_{Lv} + \sum_i C_{Ld} l_{Ld} + \sum_i C_{Vh} l_{Vh} + \sum_i C_{Vv} l_{Vv} + \sum_i C_{Vd} l_{Vd}$$

where $T_i$ is the accumulated total coupling in millivolts (mV) for the $i^{th}$ signal trace, $C_{Lh}$ is the horizontal line-to-line coupling coefficient in millivolts (mV)/millimeter (mm), $C_{Lv}$ is the vertical line-to-line coupling coefficient in mV/mm, $C_{Ld}$ is the diagonal line-to-line coupling coefficient in mV/mm, $C_{Vh}$ is the horizontal via-to-via coupling coefficient in mV/mm, $C_{Vv}$ is the vertical via-to-via coupling coefficient in mV/mm, $C_{Vd}$ is the diagonal via-to-via coupling coefficient in mV/mm, $I_{Lh}$ is the horizontal line length element in mm, $I_{Lv}$ is the vertical line length element in mm, $I_{Ld}$ is the diagonal line length element in mm, $I_{Vh}$ is the horizontal via length element in mm, $I_{Vv}$ is the vertical length element in mm, and $I_{Vd}$ is the diagonal via length element in mm.

10. A computer program product, comprising:
a computer-readable storage device; and
code stored on the computer-readable storage device, the code, when executed by a processor, is configured to cause the processor to:
extract near-end and far-end crosstalk values for traces and vias from a model of an electronic package design;
length-normalize the extracted values and allocate the normalized values to coupling factors of a cost-function;
perform a first bus routing for the electronic package design to provide a first routed design;
extract length-segments from the first routed design and insert the extracted length-segments in the cost-function;
accumulate crosstalk for each bus net using the cost-function;
in response to the accumulated crosstalk being less than a determined limit, save the first routed design; and
in response to the accumulated crosstalk being greater than the determined limit, perform an additional bus routing for the electronic package design.

11. The computer program product of claim 10, wherein code, when executed by the processor is further configured to cause the processor to:
perform a second bus routing for the design to provide a second routed design;
extract length-segments from the second routed design and inserting the extracted segments in the cost-function;
accumulate crosstalk for each bus net of the second routed design using the cost-function;
in response to the accumulated crosstalk for the second routed design being less than a determined limit for the second routed design, save the second routed design; and
in response to the accumulated crosstalk for the second routed design being greater than the determined limit for the second routed design, perform another additional bus routing for the electronic package design.

12. The computer program product of claim 10, wherein the traces include horizontal traces, vertical traces, and diagonal traces.

13. The computer program product of claim 10, wherein the vias include horizontal vias, vertical vias, and diagonal vias.

14. The computer program product of claim 10, wherein the crosstalk values include near-end crosstalk values and far-end crosstalk values.

15. The computer program product of claim 10, wherein the model is an S-parameter model.

16. The computer program product of claim 10, wherein the electronic package design is a multi-chip module design.

17. The computer program product of claim 16, wherein the multi-chip module design is a glass-ceramic multi-chip module design.

18. The computer program product of claim 10, wherein the cost-function is given by:

$$T_i = \sum_i C_{Lh} l_{Lh} + \sum_i C_{Lv} l_{Lv} + \sum_i C_{Ld} l_{Ld} + \sum_i C_{Vh} l_{Vh} + \sum_i C_{Vv} l_{Vv} + \sum_i C_{Vd} l_{Vd}$$

where $T_i$ is the accumulated total coupling in millivolts (mV) for the ith signal trace, $C_{Lh}$ is the horizontal line-to-line coupling coefficient in millivolts (mV)/millimeter (mm), $C_{Lv}$ is the vertical line-to-line coupling coefficient in mV/mm, $C_{Ld}$ is the diagonal line-to-line coupling coefficient in mV/mm, $C_{Vh}$ is the horizontal via-to-via coupling coefficient in mV/mm, $C_{Vv}$ is the vertical via-to-via coupling coefficient in mV/mm, $C_{Vd}$ is the diagonal via-to-via coupling coefficient in mV/mm, $I_{Lh}$ is the horizontal line length element in mm, $I_{Lv}$ is the vertical line length element in mm, $I_{Ld}$ is the diagonal line length element in mm, $I_{Vh}$ is the horizontal via length element in mm, $I_{Vv}$ is the vertical length element in mm, and $I_{Vd}$ is the diagonal via length element in mm.

19. A method of determining crosstalk in an electronic package design, comprising:
extracting near-end and far-end crosstalk values for horizontal, vertical and diagonal traces and vias from an S-parameter model of the electronic package design;
length-normalizing the extracted values and allocating the normalized values to coupling factors of a cost-function;
performing a first bus routing for the electronic package design to provide a first routed design;
extracting length-segments from the first routed design and inserting the extracted segments in the cost-function;
accumulating crosstalk for each bus net using the cost-function; and
in response to the accumulated crosstalk being less than a determined limit, saving the routed design; and
in response to the accumulated crosstalk being greater than the determined limit, performing an additional bus routing for the electronic package design.

20. The method of claim 19, wherein the performing the additional bus routing for the design further comprises:
performing a second bus routing for the design to provide a second routed design;
extracting length-segments from the second routed design and inserting the extracted segments in the cost-function;

accumulating crosstalk for each bus net of the second routed design using the cost-function;

in response to the accumulated crosstalk being less than a determined limit for the second routed design, saving the second routed design; and in response to the accumulated crosstalk being greater than the determined limit for the second routed design, performing an additional bus routing for the design.

21. A data processing system, comprising:

a memory; and a processor coupled to the memory, wherein the processor is configured to:

extract near-end and far-end crosstalk values for traces and vias from a model of an electronic package design;

length-normalize the extracted values and allocate the normalized values to coupling factors of a cost-function;

perform a first bus routing for the electronic package design to provide a first routed design;

extract length-segments from the first routed design and insert the extracted length-segments in the cost-function;

accumulate crosstalk for each bus net using the cost-function;

in response to the accumulated crosstalk being less than a determined limit, save the first routed design; and in response to the accumulated crosstalk being greater than the determined limit, perform an additional bus routing for the electronic package design.

* * * * *